(12) United States Patent
Carlsen

(10) Patent No.: US 6,821,489 B1
(45) Date of Patent: Nov. 23, 2004

(54) SYSTEM AND METHOD FOR ABATING THE SIMULTANEOUS FLOW OF SILANE AND ARSINE

(75) Inventor: Kurt A. Carlsen, Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 425 days.

(21) Appl. No.: 09/685,382

(22) Filed: Oct. 10, 2000

(51) Int. Cl.[7] .............................................. B01D 53/34
(52) U.S. Cl. ........................ 422/171; 422/169; 422/173
(58) Field of Search ................................. 422/168–172, 422/205, 228, 173; 55/410, 413, 415

(56) References Cited

U.S. PATENT DOCUMENTS

| | | | | |
|---|---|---|---|---|
| 3,607,104 A | * | 9/1971 | Blickle et al. | 422/141 |
| 4,627,388 A | | 12/1986 | Buice | 122/149 |
| 5,213,767 A | * | 5/1993 | Smith et al. | 422/177 |
| 5,271,908 A | * | 12/1993 | Shiban et al. | 422/228 |
| 5,495,063 A | | 2/1996 | Magenheimer et al. | 588/202 |
| 5,603,905 A | | 2/1997 | Bartz et al. | 422/173 |
| 5,955,037 A | | 9/1999 | Holst et al. | 422/171 |
| 6,051,197 A | | 4/2000 | Park | 423/210 |

FOREIGN PATENT DOCUMENTS

| | | |
|---|---|---|
| EP | 0285485 | 3/1988 |
| JP | 10309434 | 11/1998 |

* cited by examiner

Primary Examiner—Hien Tran
(74) Attorney, Agent, or Firm—Downs Rachlin Martin PLLC

(57) ABSTRACT

A system and method for abating a simultaneous flow of silane and arsine contained in an exhaust gas of DRAM processing chamber (12). The system includes a CVD abatement apparatus (20) and a resin-type adsorber (22). The CVD abatement apparatus comprises an enclosure (24) that defines a chamber (26) for receiving the exhaust gas. The enclosure contains a plurality of removable substrates (32) arranged as a series of baffles inside the enclosure. As the exhaust gas flows through the CVD abatement apparatus, the silicon within the silane is deposited as a film upon the substrates by chemical vapor deposition. The arsine continues to flow through the CVD apparatus to the adsorber where it is adsorbed by the resin contained therein. After the film has reached a particular thickness, the substrates can be removed from the enclosure, cleaned of the film and returned to the enclosure for further use.

13 Claims, 2 Drawing Sheets

ANNOTATED

SYSTEM AND METHOD FOR ABATING THE SIMULTANEOUS FLOW OF SILANE AND ARSINE

FIELD OF INVENTION

The present invention relates generally to the field of scrubbing exhaust gases. More particularly, the present invention is directed to a system and method for abating the simultaneous flow of silane and arsine gases.

BACKGROUND OF THE INVENTION

Microelectronics manufacturers utilize a number of different species of gas during the processing of wafers, which are fundamental to the manufacture of semi- and superconductor devices. Wafer processing generally involves discrete steps of growing one or more layers of various materials on a wafer and/or doping particular regions of existing layers to change the electrical characteristics of the original material. Growing a new layer and doping an existing layer typically involves flowing one or more gases into a processing chamber to effect the desired result. Some wafer processing steps require flowing only one type of gas into the processing chamber. However, other wafer processing steps require flowing two or more types of gas simultaneously with one another. Typically, only a portion of the gas(es) flowed through the processing chamber is actually consumed by the particular process. The remaining portion of the gas(es) exits the processing chamber as exhaust gas.

Generally, the exhaust gas must be processed and/or contained so that it does not contaminate the environment. When only a single gas is used for a particular processing step, the processing and/or containment of the gas is generally straightforward, requiring only one type of apparatus, such as a collection tank or scrubber. When two or more gases are used, however, processing the exhaust gases can be more difficult, particularly when one of the gases is not compatible, or interferes, with the processing of one or more of the other gases.

For example, in trench processing of wafers during the manufacture of DRAM-type memory it is desirable to simultaneously flow a carrier gas, such as silane, and a doping gas, such as arsine, into the wafer processing chamber. Since each of these gases is not used up completely during processing, the unused portions of these gases must be exhausted from the processing chamber and disposed of properly.

The abatement of arsine is a particular problem due to its high toxicity as a hydride and the high toxicity of the arsenic component of arsine. A preferred method of abating arsine is to use a dry resin-type adsorption system comprising a replaceable resin canister. Unfortunately, the relatively large amount of silane present in the exhaust gas is also collected in the resin canister, drastically reducing its useful life and increasing wafer processing cost due to the need to replace the resin canisters more often than if only the arsine were being collected in the resin canister.

Other abatement methods, such as combustion and wet-type scrubbers, are generally not desirable for abating arsine. The combustion of arsine creates a toxic particulate that is difficult to collect and dispose of. Scrubbing arsine with a wet-type scrubbers is not desirable since it would create a large amounts of toxic water that is difficult to dispose of. In addition, water scrubbing is not compatible with silane, which is insoluble and non-reactive with water.

In view of the foregoing, a need exists for an improved exhaust gas scrubbing system, and this solution is provided by the following invention.

SUMMARY OF THE INVENTION

In one aspect, the present invention is directed to an exhaust gas scrubber for removing a chemical component of an exhaust gas of a process chamber located upstream of the scrubber by chemical vapor deposition of a film. The scrubber includes an enclosure defining a chamber for receiving the exhaust gas. The enclosure has a gas inlet and a gas outlet each in fluid communication with the chamber. At least one substrate is contained within the enclosure between the gas inlet and the gas outlet. The substrate has a film deposition surface for receiving the film.

In another aspect, the present invention is directed to a system for processing a semiconductor wafer with a gas having a chemical component. The system comprises a first enclosure defining a first chamber for receiving the semiconductor wafer and the gas. The system further comprises a scrubber that includes a second enclosure defining a second chamber for receiving at least a portion of the gas from the first chamber. The second enclosure has a gas inlet in fluid communication with the first chamber and the second chamber and a gas outlet in fluid communication with the second chamber. At least one substrate is contained within the second chamber and located between the gas inlet and the gas outlet. The substrate has a film deposition surface for receiving a film composed of the chemical component of the gas.

In further aspect, the invention is directed to a method for scrubbing an exhaust gas of a manufacturing process, wherein the exhaust gas comprises a first chemical component and a second chemical component. The method includes the steps of flowing the exhaust gas through an enclosure that defines a chamber and contains at least one substrate and causing the first chemical component to be chemical vapor deposited onto the at least one substrate.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings.

DETAILED DESCRIPTION OF THE INVENTION

Figure 1:
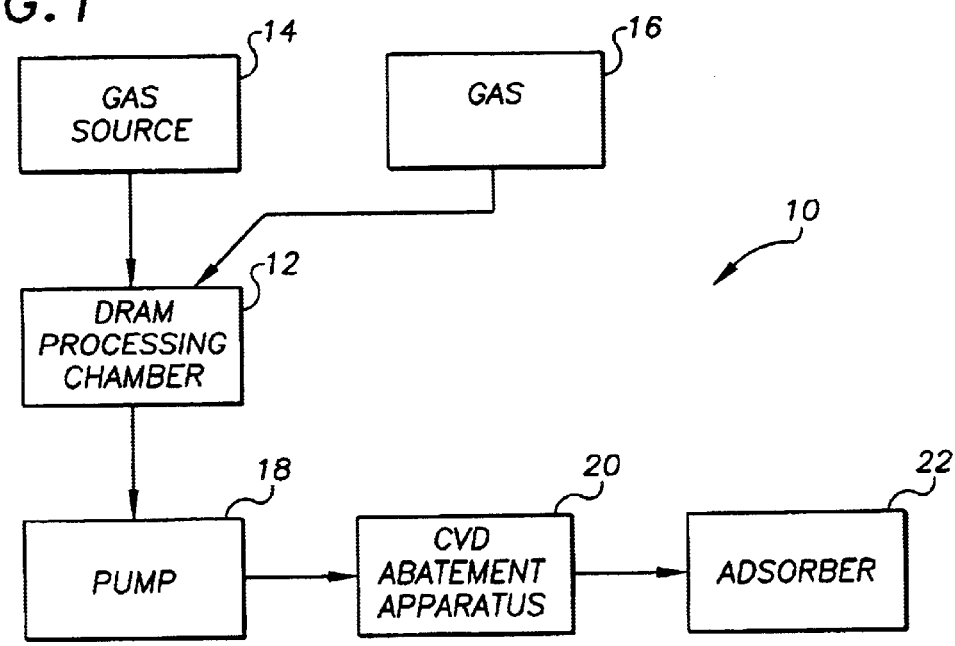
FIG. 1 is a schematic diagram illustrating a wafer processing system incorporating an abatement apparatus according to the present invention.

Referring now to the drawings, wherein like numerals indicate like elements, FIG. 1 illustrates in accordance with the present invention a dynamic random access memory (DRAM) processing system, which is denoted generally by the numeral 10. DRAM processing system 10 is used for fabricating DRAM devices on silicon wafers (not shown). During one step of the DRAM processing, silane as a carrier gas and arsine as an n-type dopant gas are flowed simultaneously with one another to grow an n-doped layer of silicon by chemical vapor deposition (CVD).

The silane and arsine are not completely consumed in growing the n-doped silicon layer, and, thus, the exhaust gas contains a mixture of silane and arsine that must be scrubbed to remove harmful components. Arsine is extremely toxic as a gas and also contains the highly toxic component arsenic, which makes abating the arsine in the exhaust gas a problem, particularly when combined with silane. A known and effective method for abating arsine is to use a resin-type adsorber. However, the silane present in the exhaust gas prematurely clogs the adsorber. DRAM processing system 10 of the present invention, therefore, comprises a means for abating the silane before reaching the adsorber.

Although the present invention is illustrated in the context of DRAM processing system 10, one skilled in the art with readily recognize that the present invention is not limited to DRAM processing. On the contrary, the system and method of the present invention may be used in connection with any type of processing, microelectronic or otherwise, that utilizes a gas, silane or otherwise, having a constituent component that may be removed from the gas in a manner contemplated by the present invention.

DRAM processing system 10 includes a processing chamber 12, wherein the processing of a wafer (not shown) to form DRAM devices takes place. As mentioned above, the wafer processing includes a CVD/doping step utilizing the simultaneous flow of silane and arsine. This step is performed at growing/doping conditions known to those skilled in the art. Therefore, the particulars of this processing step are not described in detail herein. The silane and arsine gases are flowed into processing chamber 12 from gas sources 14, 16 and the portion of the gases not consumed in the processing chamber are exhausted from the processing chamber by a pump 18. Pump 18 pumps the exhaust gas first through a CVD abatement apparatus 20 and then to a resin-type adsorber 22.

CVD abatement apparatus 20 scrubs the exhaust gas by preferably removing most, and more preferably removing all, of the silicon from the silane by CVD. In this manner, most or all of the silicon is removed from the exhaust gas before the exhaust gas reaches adsorber 22 so that the silicon does not prematurely clog the adsorber.

Figure 2:
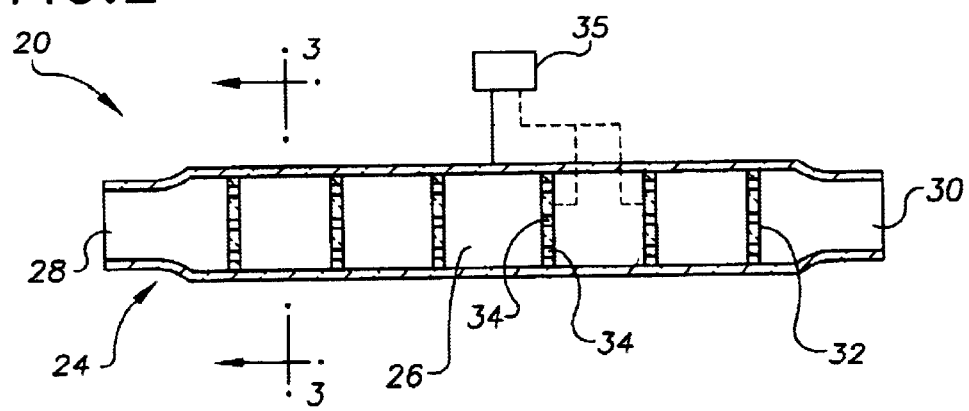
FIG. 2 is a cross-sectional view of one embodiment of a chemical vapor deposition chamber that is part of the abatement apparatus illustrated in FIG. 1.

Referring to FIG. 2, CVD abatement apparatus 20 comprises an enclosure 24 that defines a CVD chamber 26, a gas inlet 28 and a gas outlet 30. Enclosure 24 contains a plurality of substrates 32 onto which the silicon from the silane is deposited by CVD. As used herein and in the claims appended hereto, the term "substrate" means any structure having a surface onto which a component of the exhaust gas may be deposited by vapor deposition. This meaning, therefore, encompasses the disc-shaped substrates 32 shown as well as enclosure 24, which has interior walls capable of receiving vapor deposited material.

Enclosure 24 and substrates 32 are preferably made of quartz to withstand the relatively high operating temperatures necessary for depositing the silicon. However, other materials, such as graphite, may be used. Gas inlet 28 is in fluid communication with CVD chamber 26 and receives the exhaust gas from pump 18. Gas outlet 30 is also in fluid communication with CVD chamber 26 and allows the exhaust gas to pass from the CVD chamber to adsorber 22.

Enclosure 24 is preferably a cylindrical tube and substrates 32 are preferably disc-shaped as shown. However, enclosure 24 may be another tubular shape or may be configured otherwise, such as an enclosure having a plurality of interior walls forming a serpentine chamber within the enclosure. Similarly, substrates 32 may be another shape, such as rectangular, oval, among others, to suit a particular application. In addition, although a plurality of substrates 32 are preferred, a single substrate may be used. Moreover, substrates 32 are preferably arranged within enclosure 24 to form a series of baffles, which slow down the flow of the exhaust gas and allows more silicon to be deposited onto the substrates. One skilled in the art will recognize the variety of enclosure and substrate shapes and arrangements that may be used in accordance with the present invention.

Figure 3:
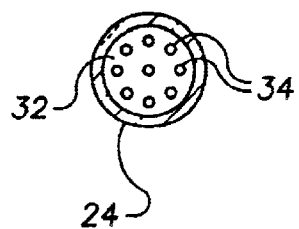
FIG. 3 is a cross-sectional view of the chemical vapor deposition chamber of FIG. 2 as taken along line 3—3.

Referring to FIG. 3, each of substrates 32 includes a plurality of apertures 34, which allow the exhaust gas pass therethrough a; it flows through CVD chamber 26 from gas inlet 28 to gas oulet 30. The number, shape and size of apertures 34 may be varied on each substrate 32 and among a number of substrates to suit a particular application, depending on design parameters such as number of substrates, amount of silane contained in the exhaust gas and velocity of exhaust gas through CVD chamber 26. In one embodiment, a substrate 32 includes nine apertures each having a diameter of 0.75 inches. Substrates 32 are preferably removably mounted within CVD chamber 26 so that they may be periodically removed, cleaned of the deposited silicon and replaced for further use. The deposited silicon may be removed from substrates 32, e.g., by chemical etching. Providing removable and reusable substrates 32 will reduce the lifetime cost of operating the CVD abatement apparatus. However, if desired, substrates 32 need not be removable. In this situation, entire enclosure 24 and substrates 32 may be disposed of when the silicon deposits on the substrates reach a maximum thickness.

To deposit silicon from the silane onto substrates 32 using CVD, the temperature of the substrates and/or gas entering chamber should be about 800° C. to about 1200° C., more preferably about 1100° C. Thus, CVD abatement apparatus 20 includes a heater 35 to heat CVD chamber 26, substrates 32 or both.

Figure 4:
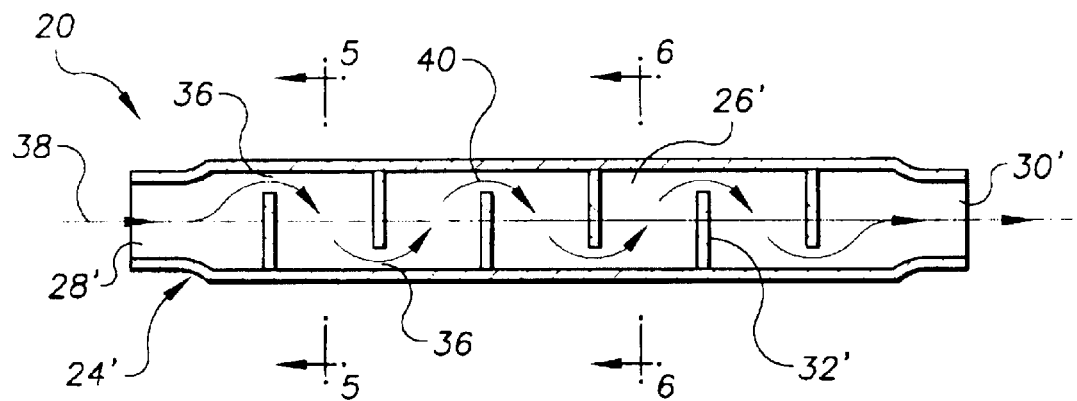
FIG. 4 is a cross-sectional view of another embodiment of a chemical vapor deposition chamber that is part of the abatement apparatus illustrated in FIG. 1.
Figure 5:
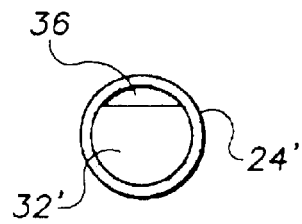
FIG. 5 is a cross-sectional view of the chemical vapor deposition chamber of FIG. 4 as taken along line 5—5.
Figure 6:
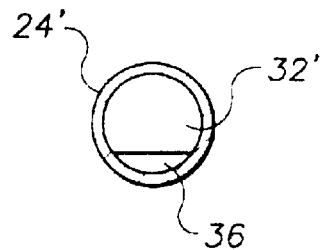
FIG. 6 is a cross-sectional view of the chemical vapor deposition chamber of FIG. 4 as taken along line 6—6.

FIGS. 4-6 shows an alternative embodiment of CVD abatement apparatus 20 comprising an enclosure 24' containing six substrates 32' forming a series of baffles that define a generally serpentine CVD chamber 26' within the enclosure. Enclosure 24' comprises a cylindrical tube similar to enclosure 24 described above. Each substrate 32' is generally a truncated disc located within enclosure 24' such that an opening 36 is defined between the substrate and the interior wall of the enclosure. Openings 36 are alternatingly located on opposite sides of a horizontal plane 38 bisecting enclosure 24' along its length such that an exhaust gas flowing from gas inlet 28' to gas outlet 30' is slowed by substrates 32' and forced to follow a generally serpentine path 40 through the enclosure. Although enclosure 24' is shown as having a circular cross-sectional shape, another shape such as oval, hexagonal and square, among others, may be used. In addition, although substrates 32' are shown as being truncated discs, the substrates may be configured otherwise. For example, for cylindrical enclosure 24', each substrate may be disc-shaped and have one or more apertures in lieu of the truncated portion of substrates 32'. Moreover, path 40 may be other than serpentine such as. e.g., spiral. A spiral path may be formed, e.g., by positioning each opening 36 spaced 90° apart from the preceding opening, progressing from gas inlet 28' to gas outlet 30'.

Alternative embodiments of DRAM processing system 10 of the present invention may include other components not shown in FIG. 1. For example, DRAM processing system 10 may further include a diverter (not shown) and wet-type scrubber (not shown) both downstream of pump 18 for abating hydrogen chloride (HCL) gas flowed through system 10 non-simultaneously with the silane and arsine to affect another step of the wafer processing. In this embodiment, the diverter is used to divert the HCL gas away from CVD abatement apparatus 20 and adsorber 22 to the wet-type scrubber. When the silane and arsine are again flowed through processing chamber 12, the diverter would then be used to divert the exhaust gas from the wet-type scrubber to CVD abatement apparatus 20 and adsorber 22. In addition, another type of abatement apparatus may be substituted for resin-type adsorber 22, which is provided specifically for abating arsine. For example, other gases may require a wet-type scrubber.

In alternative embodiments of the invention, the components of the processing system may be arranged differently from the components of DRAM processing system 10. For example, in another type of processing system, pump 18 may be located downstream of CVD abatement apparatus 20. In addition, one or more components, such as pump 18 and adsorber 22, may be eliminated from the system. For example, in a positive pressure system, wherein the processing in the processing chamber is carried out under positive pressure, a pump may not be necessary. In this case, one or more pressure regulators located downstream of gas sources 14, 16 may be used to control the positive pressure that would force the exhaust gas through CVD abatement apparatus. Adsorber 22 may be eliminated if the effluent gas of CVD abatement apparatus 20 does not require further scrubbing. For example, depending upon the particular process, the effluent gas of CVD abatement apparatus 20 may contain only non-toxic components such that the effluent gas need only be contained in a holding tank. One skilled in the art will appreciate the various and diverse processing systems that may be designed to utilize the CVD abatement apparatus and method of the present invention.

While the present invention has been described in connection with a preferred embodiment, it will be understood that it is not so limited. On the contrary, it is intended to cover all alternatives, modifications and equivalents as may be included within the spirit and scope of the invention as defined in the appended claims.

What is claimed is:

1. A scrubber system, comprising:
   a. a first chamber operatively configured to contain a process;
   b. an exhaust gas resulting from said process and consisting of a first component and a second component; and
   c. a second chamber that includes an inlet and an outlet and contains at least one substrate, said inlet receiving said exhaust gas, said outlet exhausting from said second chamber substantially only said first component of said exhaust gas, and said at least one substrate having deposited thereon by vapor deposition said second component of said exhaust gas.

2. A systemn according to claim 1, wherein said at least one substrate is made of quartz.

3. A system according to claim 1, wherein said at least one substrate forms a baffle within said second chamber.

4. A system according to claim 3, wherein said baffle includes a plurality of apertures for allowing said exhaust gas to flow through said baffle.

5. A system according to claim 1, further comprising a plurality of said substrates forming a series of baffles within said second chamber.

6. A system according to claim 5, wherein each baffle of said series of baffles includes a plurality of apertures for allowing said exhaust gas to flow through each of said series of baffles.

7. A system according to claim 5, wherein said series of baffles define a serpentine passageway within said second chamber.

8. A system according to claim 1, further comprising a heating element for heating at least one of said second chamber and said at least one substrate.

9. A system according to claim 1, wherein said at least one substrate is removable and reusable.

10. A system according to claim 1, wherein said second component of said exhaust gas comprises silicon.

11. A scrubber system, comprising:
    a. a processing chamber operatively configured to contain a process;
    b. an exhaust gas generated by said process and consisting of a non-toxic part and a toxic part;
    c. a first apparatus, in fluid communication with said processing chamber, removing at least a portion of said non-toxic part of said exhaust gas by chemical vapor deposition;
    d. a second apparatus, in fluid communication with said first apparatus, removing at least a portion of said toxic part from said exhaust gas.

12. A system according to claim 11, wherein said non-toxic part comprises silicon.

13. A system according to claim 11, wherein said toxic part comprises arsenic.

* * * * *